United States Patent [19]

Reed

[11] Patent Number: 4,531,098
[45] Date of Patent: Jul. 23, 1985

[54] WIDE DYNAMIC RANGE AMPLIFIER WITH SECOND HARMONIC SIGNAL CANCELLATION

[75] Inventor: John C. Reed, Chandler, Ariz.

[73] Assignee: Motorola, Inc., Schaumburg, Ill.

[21] Appl. No.: 596,963

[22] Filed: Apr. 5, 1984

[51] Int. Cl.³ .......................... H03F 1/26; H03F 3/60
[52] U.S. Cl. .................. 330/53; 330/124 R;
 330/149; 330/295; 333/109; 333/125
[58] Field of Search ............... 330/53, 55, 147, 148,
 330/149, 286, 287, 302, 124 R, 295; 328/162,
 165; 333/109, 116, 117, 127, 128

[56] References Cited

U.S. PATENT DOCUMENTS

| 3,371,284 | 2/1968 | Engelbrecht | 333/112 X |
| 3,516,024 | 6/1970 | Lange | 333/116 |
| 4,263,559 | 4/1981 | Ho | 330/286 X |
| 4,352,071 | 9/1982 | Childs et al. | 333/116 X |

OTHER PUBLICATIONS

Franke, Earnest A. and Noorani, Ahamed E., "Wilkinson Hybrid With Quarter-Wave Offset", *R. F. Design*, Nov. 1981, pp. 32–38.

*Primary Examiner*—James B. Mullins
*Assistant Examiner*—Steven J. Mottola
*Attorney, Agent, or Firm*—Eugene A. Parsons

[57] ABSTRACT

The signal to be amplified is applied to a quadrature coupler which splits the signal equally to provide two output signals in phase quadrature. The quadrature signals are amplified equally, which generates a second harmonic in each of the signals 180 degrees out of phase. The amplified signals are combined in an in-phase power divider to provide a single amplified output signal wherein the out-of-phase second harmonic signals cancel.

9 Claims, 2 Drawing Figures

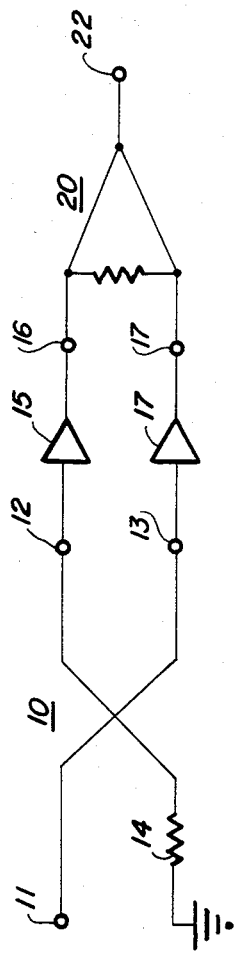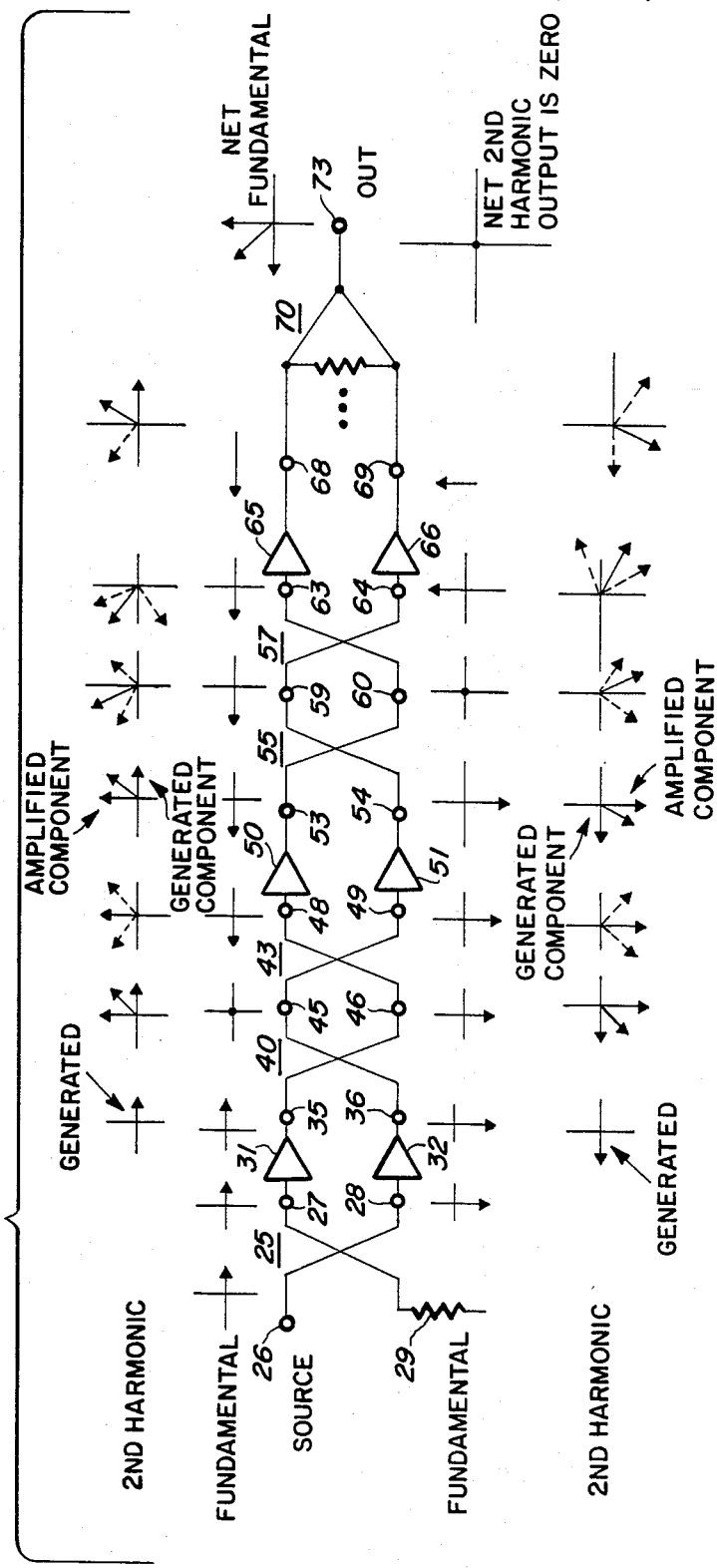

WIDE DYNAMIC RANGE AMPLIFIER WITH SECOND HARMONIC SIGNAL CANCELLATION

BACKGROUND OF THE INVENTION

A major problem in the amplification of electronic signals is the generation of second harmonic signals. In general, all amplifying devices, e.g. tubes, transistors and other semiconductor devices, are nonlinear to some extent. This nonlinearity in the amplifying device generates second harmonic signals which are extremely undesirable. In general, as the dynamic range of the amplifier is increased or as the amplification is increased the distortion due to the second harmonic is increased. Thus, to maintain the distortion of an amplifier within a permissible range, the dynamic range or amplification must be reduced. Because of the limitations due to second harmonic distortion additional and more costly amplifying stages may be required which greatly increases the size and expense of the amplifier.

SUMMARY OF THE INVENTION

The present invention pertains to a wide dynamic range amplifier with second harmonic signal cancellation which amplifier includes a quadrature coupler adapted to receive the signal to be amplified and provide a pair of output signals in phase quadrature. Amplifiers are connected to the quadrature coupler outputs and provide a pair of amplified output signals including second harmonic signals 180 degrees out of phase. The two output signals from the amplifiers are combined in an in-phase power divider so that the out-of-phase second harmonic signals cancel and the output is a single signal substantially free of second harmonic signals.

It is an object of the present invention to provide a new and improved wideband dynamic range amplifier with second harmonic signal cancellation.

It is a further object of the present invention to provide a wide dynamic range amplifier wherein second harmonic signals generated therein are out of phase and cancel when subsequently combined.

It is a further object of the present invention to provide a wide dynamic range amplifier which is more compact and less expensive than prior art amplifiers incorporating second harmonic signal cancellation.

These and other objects of this invention will become apparent to those skilled in the art upon consideration of the accompanying specification, claims and drawings.

BRIEF DESCRIPTION OF THE DRAWINGS

Referring to the drawings,

FIG. 1 is a simplified schematic diagram of a wide dynamic range amplifier embodying the present invention;

FIG. 2 is a second embodiment of the present invention in a wide dynamic range amplifier further illustrating the phase of fundamental and second harmonic signals at various points in the schematic.

DESCRIPTION OF THE PREFERRED EMBODIMENT

Referring specifically to FIG. 1, the number 10 generally designates a quadrature coupler having an input terminal 11 and two output terminals 12 and 13. The quadrature coupler 10 is constructed so that a signal applied to the input terminal 11 is split into two signals at the output terminals 12 and 13, which signals are substantially equal in amplitude and 90 degrees out of phase, or in phase quadrature. A second input terminal of coupler 10 is terminated in an impedance 14 which may be the characteristic impedance of the coupler 10 to reduce reflected power. A variety of quadrature couplers are available, including quadrature hybrid circuits, and any circuit which performs the function of splitting the input signal into two quadrature signals of a desired amplitude can be utilized.

The output signal at the terminal 12 is applied to an amplifying device 15 having an output at a terminal 16. The signal at terminal 13 is applied to an amplifying device 17 having an output at a terminal 18. The amplified signals at the terminals 16 and 18 are applied to two inputs of an in-phase power divider, generally designated 20, where the two input signals are combined to supply a single output signal at an output terminal 22. The amplifying devices 15 and 17 may include any of the well known active devices such as tubes, transistors, or other semiconductor devices. Further, the amplifying devices 15 and 17 may include a plurality of amplifying stages, or a plurality of active devices to obtain the desired amplification. The in-phase power divider 20 may be any of the well known circuits, such as a Wilkinson power divider or any other power divider that performs the described functions.

It is well known in the art that all amplifying devices include some nonlinearity so that some second harmonic signals are generated during the amplification of the desired or fundamental signal. In the operation of the circuit illustrated in FIG. 1 a signal, which may be designated $\theta$ for convenience, is applied to the terminal 11. The signal $\theta$ appears at terminal 12 and the signal $\theta - 90°$ appears at the terminal 13 (ignoring the amplitude of the signal for convenience). When the signal $\theta$ is amplified in amplifier 15, the second harmonic to $\theta$ is generated and appears at the terminal 16, along with the fundamental signal $\theta$. Similarly, when the signal $\theta - 90$ is amplified in the amplifier 17 the second harmonic is generated, which is twice the frequency of the signal applied thereto, or $2\theta - 180°$, which signal appears at the terminal 18 along with the amplified fundamental signal $\theta - 90°$. When the two second harmonic signals are combined in the in-phase power divider 20 they cancel because the signals on terminals 16 and 18 are 180° out of phase. The fundamental signals at terminals 16 and 18 are 90° out of phase and recombine to provide the desired amplified fundamental signal.

While it is assumed that the phase shifts are exactly as described to provide 100 percent cancellation it will of course be understood by those skilled in the art that actual phase shifts and cancellation may differ somewhat from theoretical but the second harmonic cancellation should be well within allowable tolerances. Further, while it is assumed that the quadrature coupler 10 splits the signal equally between terminals 12 and 13 and the amplifiers 15 and 17 are equal, it will be understood by those skilled in the art that some adjustments in amplification might be utilized to insure that the second harmonic signals combine in the in-phase power divider 20 to substantially cancel the second harmonic signal.

Referring specifically to FIG. 2, a second embodiment of a wide dynamic range amplifier is illustrated with a vector representation of the fundamental and second harmonic signals at various points therethrough to illustrate the operation thereof. In this embodiment a quadrature coupler generally designated 25 has an input terminal 26 adapted to receive an input signal and a pair of output terminals 27 and 28 with output signals in phase quadrature thereon. A second input of the quadrature coupler 25 is illustrated terminated in its characteristic impedance 29, which terminates reflected power in a fashion well known to those skilled in the use of quadrature couplers. The output terminals 27 and 28 are connected through amplifiers 31 and 32, respectively, to input terminals 35 and 36 of a quadrature coupler generally designated 40. Output terminals of the quadrature coupler 40 are connected directly to input terminals of a quadrature coupler generally designated 43 at terminals 45 and 46, respectively. The quadrature coupler 43 has a pair of outputs 48 and 49 which are connected to a pair of amplifiers 50 and 51, respectively. The outputs of the amplifiers 50 and 51 are connected to a pair of input terminals 53 and 54 of a quadrature coupler generally designated 55. Two output terminals of the quadrature coupler 55 are directly connected to two input terminals of a quadrature coupler generally designated 57, which direct connections are designated 59 and 60. The quadrature coupler 57 has a pair of outputs 63 and 64 which are connected to a pair of amplifiers 65 and 66, respectively. The outputs of the amplifier 65 and 66 are connected to two input terminals 68 and 69 of an in-phase power divider generally designated 70. An output terminal 73 of the power divider 70 is the output of the wide dynamic range amplifier.

Referring to the vector diagrams to illustrate the operation of the circuit of FIG. 2, a fundamental signal is applied to the input terminal 26. The fundamental appears in phase at terminal 27 and 90° out of phase at terminal 28. After amplification the fundamental appears in phase at terminal 35 and 90° out of phase at terminal 36. In addition, a second harmonic is generated in amplifiers 31 and 32, which second harmonic appears in phase at terminal 35 and 180° out of phase at terminal 36. The quadrature coupler 40 is connected to receive two inputs at terminals 35 and 36 and supply two outputs at terminals 45 and 46. Since the fundamental at terminal 35 and the fundamental at terminal 36 are 90° out of phase these signals will cancel at terminal 45 and add at terminal 46. The resultant of the two second harmonic signals applied to the quadrature coupler 40 is at 45 degrees at terminal 45 and 225° at terminal 46. Similarly, the relationship of the fundamental and the second harmonic at each of the various terminals is illustrated so that the progression of the fundamental and second harmonic through the amplifier can be easily seen. At the input terminals 68 and 69 to the power divider 70 it can be seen that the fundamental on the terminal 69 is 90° out of phase with the fundamental on the terminal 68 so that when they are combined the resultant signal provides the desired amplification. The resultant second harmonic signal at the terminal 69 is 180° out of phase with the resultant second harmonic signal at the terminal 68 so that upon combining the two signals in the power divider 70 the net second harmonic output signal is zero.

In this particular embodiment the second harmonic signal is not cancelled in each of the amplifying stages but is carried through and cancelled during combining in the in-phase power divider 70. However, because the intermediate quadrature couplers utilize both inputs, instead of having one of the inputs terminated in its characteristic impedance, there is no reduction in the gain provided by the amplification stages.

In a possible third embodiment several of the units illustrated in FIG. 1 may be ganged together so that the input terminal of the second unit is connected to the output terminal of the first unit, the input terminal of the third unit is connected to the output terminal of the second unit, etc. The cascading of the stages in this fashion provides the advantage of interstage isolation, since reflected power is terminated in the characteristic impedance of the terminated input terminal, and the second harmonics are rejected in each stage. However, these improvements are obtained at a cost of 3 dB less gain per stage than in the circuit of FIG. 2.

Thus, several embodiments of a wide dynamic range amplifier with second harmonic signal cancellation are disclosed. In each of these embodiments the structure is substantially simplified, more compact and less expensive because of the method of cancelling the second harmonic. Any of the disclosed embodiments, in conjunction with an appropriate bandpass filter at the output, allow up to 3:1 operating bandwith factors for amplifiers while maintaining wide dynamic range with no, or substantially reduced, harmonic distortion at the output. For realistic maximum imbalances of 3° in phase and 0.5 dB in amplitude, it can be shown that the second harmonic rejection will be greater than 20 dB.

While I have shown and described several specific embodiments of this invention, further modifications and improvements will occur to those skilled in the art. I desire it to be understood, therefore, that this invention is not limited to the particular forms shown and I intend in the appended claims to cover all modifications which do not depart from the spirit and scope of this invention.

I claim:

1. A wide dynamic range amplifier with second harmonic signal concellation comprising:
    a quadrature coupler having an input adapted to receive a signal to be amplified and a pair of outputs having output signals thereon which are in phase quadrature;
    amplifying means coupled to the pair of outputs for amplifying each of the output signals and providing two amplified output signals including second harmonic signals 180° out of phase; and
    an in-phase power divider having two inputs coupled to receive the two amplified output signals, said power divider combining the two signals to provide at an output thereof a single signal substantially free of second harmonic signals.

2. An amplifier as claimed in claim 1 wherein the quadrature coupler has a second input terminated in its characteristic impedance.

3. An amplifier as claimed in claim 1 wherein the amplifying means includes a plurality of amplifying stages.

4. An amplifier as claimed in claim 3 wherein the plurality of amplifying stages include quadrature couplers interspersed therebetween.

5. An amplifier as claimed in claim 4 wherein each of the interspersed quadrature couplers have a pair of inputs connected to the previous amplifying stage outputs and a pair of outputs connected to the following amplifying stage inputs.

6. An amplifier as claimed in claim 1 wherein the quadrature coupler splits the input signal substantially equally between the pair of outputs.

7. An amplifier as claimed in claim 6 wherein the amplifying means substantially equally amplifies each of the pair of output signals supplied thereof.

8. A wide dynamic range amplifier with second harmonic signal cancellation comprising:

amplifying means coupled to receive a signal to be amplified at an input thereof and including a quadrature coupler for providing a pair of substantially equal output signals including second harmonic signals 180° out of phase;

a combining circuit coupled to receive the pair of output signals and combine the signals to provide a single signal substantially free of second harmonic signals.

9. A method of amplifying a useful signal without producing substantial second harmonic signal distortion comprising the steps of:

quadrature coupling the useful signal to be amplified to a pair of output terminals so that the signals appearing at the pair of output terminals are substantially equal in amplitude and in phase quadrature;

amplifying the signals appearing at the pair of output terminals substantially equally; and combining the two amplified signals to provide a single amplified useful signal substantially free of second harmonic signals.

* * * * *